(12) United States Patent
Ishigaki et al.

(10) Patent No.: US 8,736,292 B2
(45) Date of Patent: May 27, 2014

(54) PROBE CARD AND INSPECTION APPARATUS

(75) Inventors: Tatsuo Ishigaki, Tokyo (JP); Katsuji Hoshi, Tokyo (JP); Akihisa Akahira, Tokyo (JP)

(73) Assignee: Kabushiki Kaisha Nihon Micronics, Tokyo (JP)

( * ) Notice: Subject to any disclaimer, the term of this patent is extended or adjusted under 35 U.S.C. 154(b) by 245 days.

(21) Appl. No.: 12/788,874

(22) Filed: May 27, 2010

(65) Prior Publication Data

US 2010/0327898 A1 Dec. 30, 2010

(30) Foreign Application Priority Data

Jun. 29, 2009 (JP) ................................. 2009-153892

(51) Int. Cl.
*G01R 31/02* (2006.01)

(52) U.S. Cl.
USPC ..................... 324/754; 324/754.03; 324/754.1

(58) Field of Classification Search
CPC ... G01R 1/07385; G01R 31/2889; G01R 3/00
USPC ......................................................... 324/754
See application file for complete search history.

(56) References Cited

U.S. PATENT DOCUMENTS

| | | | |
|---|---|---|---|
| 4,407,094 A * | 10/1983 | Bennett et al. | .................... 451/1 |
| 2002/0096677 A1 * | 7/2002 | Yuuki et al. | ..................... 257/48 |
| 2009/0021272 A1 | 1/2009 | Komatsu et al. | |

FOREIGN PATENT DOCUMENTS

| | | |
|---|---|---|
| JP | 06-053299 | 2/1994 |
| JP | 06-151531 | 5/1994 |
| JP | 2001-242222 | 9/2001 |
| JP | 2002-122632 | 4/2002 |
| JP | 2006-058104 | 3/2006 |
| JP | 2008-180616 | 8/2008 |
| TW | 200921110 A | 5/2009 |

OTHER PUBLICATIONS

Search Report in corresponding Taiwan Patent Application No. 099109410 issued on Nov. 6, 2013.

* cited by examiner

*Primary Examiner* — Thomas F Valone
(74) *Attorney, Agent, or Firm* — Bacon & Thomas, PLLC (57) ABSTRACT

An automatic switching mechanism is controlled by a probe card independent from a tester without limitation of the number of control signals from the tester. A probe card and an inspection apparatus include probes to be brought into contact with electrodes of inspection targets and a power supply channel electrically connecting the probes to a tester. The automatic switching mechanism divides each of the power supply channels into a plurality of power supply wiring portions, which are respectively connected to the probes; and shuts off the power supply wiring responsive to electrical fluctuation such as overcurrent. An electrical fluctuation detection mechanism detects an electrical fluctuation due to a defective product among the inspection targets. A control mechanism, responsive to detection of an electrical fluctuation, shuts off the power supply wiring portion if the electrical fluctuation is caused by the automatic switching mechanism.

8 Claims, 4 Drawing Sheets

PROBE CARD AND INSPECTION APPARATUS

CROSS-REFERENCE TO RELATED APPLICATION

This application claims, under 35 USC 119, priority of Japanese Application No. 2009-153892 filed Jun. 29, 2009.

BACKGROUND OF THE INVENTION

1. Technical Field

The present invention relates to a probe card for conducting an inspection by branching each of a plurality of power supply channels for inspection and using a probe connected to each of a power supply wiring portion in the number larger than that of the power supply channels and an inspection apparatus using the probe card.

2. Background Art

An inspection apparatus for inspecting an inspection target such as an IC chip on a semiconductor wafer is generally known. This inspection is carried out by bringing a probe of this inspection apparatus to each electrode of the inspection target.

Figure 1:
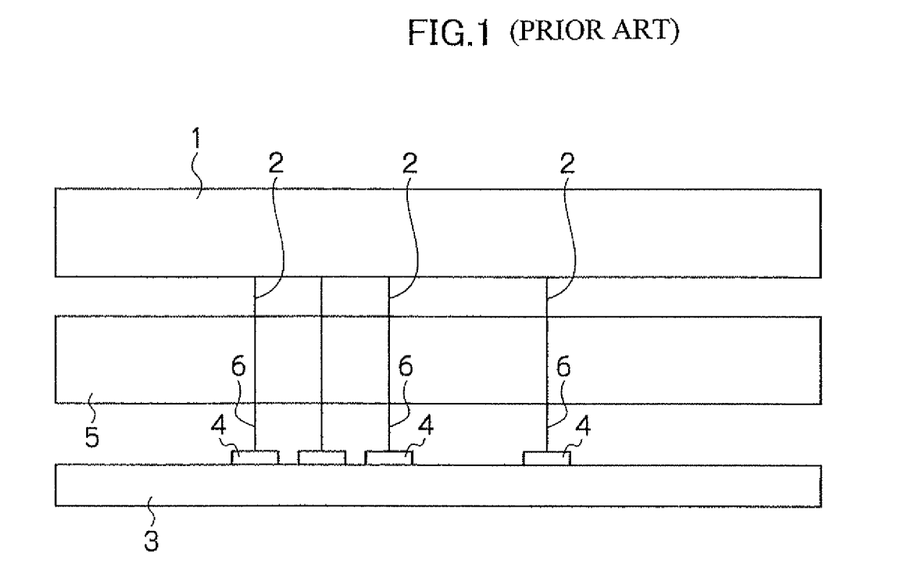
FIG. 1 is an outline configuration diagram illustrating a conventional inspection apparatus.

In such an inspection apparatus, as shown in FIG. 1, power supply channels 2 for inspection from a tester 1 are provided in the number equal to that of IC chips 4 of a semiconductor wafer 3 to be inspected. However, if the number of the power supply channels 2 is equal to that of the IC chips 4, the number of the IC chips 4 is increased, and even if probes 6 are increased according to the increase, all the IC chips 4 cannot be measured at the same time. That is, even though the number of probes 6 that can be in contact with all the IC chips 4 on the semiconductor wafer 3 are prepared on a probe card 5 side, if the tester 1 side does not correspond to all the IC chips 4, simultaneous measurement cannot be made.

Figure 2:
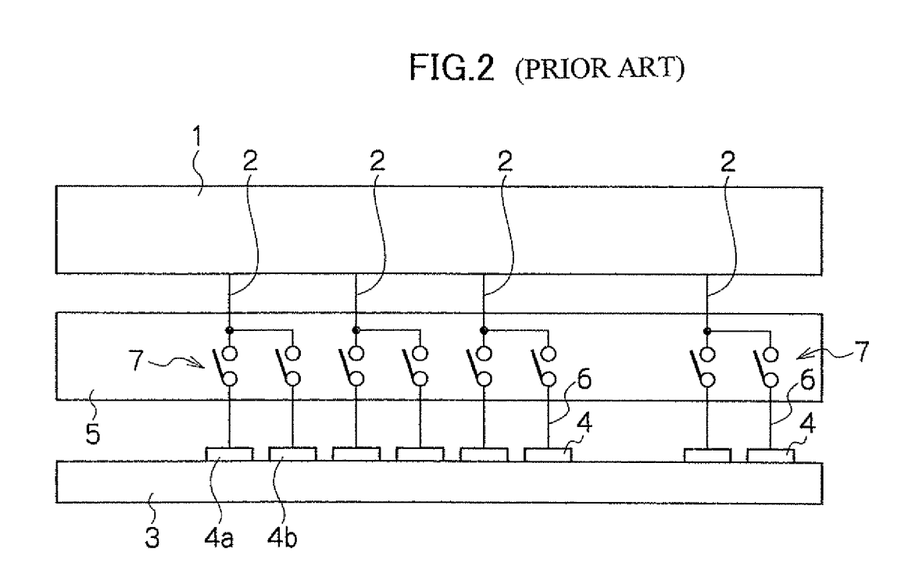
FIG. 2 is an outline configuration diagram illustrating a conventional inspection apparatus provided with a switching mechanism.

In order to solve the above problem, as shown in FIG. 2, there is known an inspection device for simultaneously measuring the IC chips 4 in the number larger than the number of the power supply channels 2 by branching the power supply channel 2 of the tester 1 on the probe card 5 into plural. An example of such an inspection apparatus is disclosed in Japanese Patent Laid-Open No. 2002-122632 (Patent Document 1).

In this inspection apparatus, if a defective IC chip is included, a normal power supply cannot be applied to other normal IC chips connected to the same power supply channel 2 as the defective IC chip. Thus, a switching mechanism 7 is provided, and in order to exclude the IC chip determined as defected from measurement targets, the defective IC chip is separated from the power supply by the switching mechanism 7, fluctuation in a potential or shortage in a current supply amount is suppressed, and other elements are inspected.

SUMMARY OF THE INVENTION

However, in the conventional technique of Patent Document 1, a first IC chip 4a and a second IC chip 4b are connected to the same power supply channel 2, respectively, for example, and if electrical fluctuation such as an overcurrent is generated in the first IC chip 4a at measurement, the tester 1 side cannot determine which of the IC chips 4 is defective. Therefore, the applicable power supply channel 2 is shut off, and both the first IC chip 4a and the second IC chip 4b are determined as defective, which deteriorates a non-defective rate.

Also, if the switching mechanism 7 is provided in order to separate the defective IC chip 4, a control signal for controlling the switching mechanism 7 needs to be prepared on the tester 1 side, but since there is a limitation on the number of relay control channels disposed on the tester 1 side, the number of IC chips which can be measured at the same time cannot be increased.

The present invention was made in view of the above problems and has an object to provide a probe card and an inspection apparatus which can maximize the number of simultaneous measurements with a limited number of power supply channels and also reliably shut off a defective IC chip.

A probe card according to the present invention is a probe card provided with a plurality of probes to be brought into contact with each of a plurality of electrodes of a single or a plurality of inspection targets and a power supply channel electrically connecting the plurality of probes to a tester, respectively, and supplying test power supply from the tester to each of the plurality of electrodes of the inspection target, including an automatic switching mechanism which is provided at each power supply channel, branches each power supply channel to a plurality of power supply wiring portions and connects it to each probe, respectively, and shuts off the power supply wiring portion on the basis of electrical fluctuation such as overcurrent, an electrical fluctuation detection mechanism provided at each of the power supply wiring portions after branching by the automatic switching mechanism and detecting the electrical fluctuation if the electrical fluctuation occurs due to presence of a defective product in the single or plurality of the inspection targets, and a control mechanism which shuts off the power supply wiring portion where the electrical fluctuation is caused by the automatic switching mechanism if the electrical fluctuation is detected by the electrical fluctuation detection mechanism.

Advantageous Effects of Invention

In the present invention, since control of the automatic switching mechanism is performed in the probe card and is made independent from the tester, the inspection targets can be increased without limitation by the number of control signals from the tester.

DESCRIPTION OF THE PREFERRED EMBODIMENTS

A probe card and an inspection apparatus according to an embodiment of the present invention will be described below referring to the attached drawings.

The probe card and the inspection apparatus of this embodiment are intended to achieve higher efficiency in a test of an inspection target such as an IC chip on a semiconductor wafer. With the purpose of improving efficiency in measurement, improvement was made for compensating a shortage of the number of power supply channels of a tester in simultaneous measurement of a large number of inspection targets. Specifically, the present invention relates to improvement of a circuit portion to be mounted on the probe card. Thus, the present invention can be applied to a probe card in general and also can be applied to all the inspection apparatuses in which the probe card is used. As mentioned above, since the present invention can be applied to various types of the probe card and the inspection apparatus, a circuit configuration portion to be mounted on the probe card will be mainly described in the following. Also, IC chips formed in a large number on a semiconductor wafer will be described as an example of an inspection target.

The probe card and the inspection apparatus according to the present invention is provided with an automatic switching mechanism which, if a defective chip is included in the plurality of IC chips to be inspected, automatically separates the defective chip from the power supply channel. By means of this automatic switching mechanism, the defective chip can be automatically separated from the power supply channel independently from the tester. By means of the automatic switching mechanism, the defective chip is automatically separated from the power supply channel, and only a normal chip is connected to the power supply channel to which the plurality of IC chips including the defective chip are connected and measured. In a conventional example, as mentioned above, a control signal for controlling the switching mechanism 7 needs to be created by the tester 1, but since the number of relay control channels provided on the tester side is limited, there was no room for newly providing a channel for a control signal of the switching mechanism 7, and the number which can be measured simultaneously could not be increased.

On the other hand, in the present invention, switching control of the power supply channel is made independent by separating it from the tester side. Specifically, an automatic switching mechanism for switching the power supply channel on the basis of independent determination is provided on the probe card side so that the number of IC chips that can be inspected simultaneously without increasing the number of control channels for switching is increased and a yield is improved. The probe card and the inspection apparatus of this embodiment are described below mainly on a control circuit mounted on the probe card.

Basic Example 1

The inspection apparatus of this embodiment is an apparatus for simultaneously measuring a plurality of IC chips by branching each power supply channel to plural on the probe card, connecting it to a plurality of the IC chips and supplying test power supply, in which a detection function for detecting abnormality in the IC chip being inspected and shutting off the test power supply to the IC chip in which the abnormality was detected is provided on the probe card. A circuit on the probe card of this inspection apparatus incorporates an element functioning as an automatic switching mechanism, which will be described later, an electrical fluctuation detection mechanism, and a control mechanism. As a result, if there is a defective chip, the test power supply applied to the defective chip is shut off, by which an influence such as a noise to other chips branching from the power supply channel shared by the defective chip is shut off. The test power supply refers to a driving power supply for driving the IC chip to be inspected for the inspection or various power supplies applied to an electrode of the IC chip through the probe such as an inspection signal.

Figure 3:
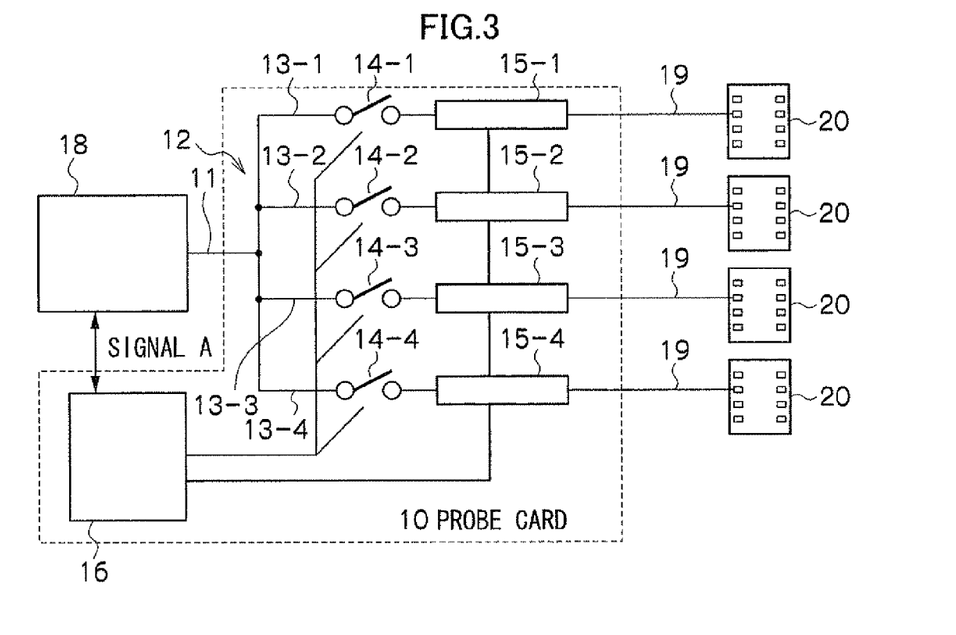
FIG. 3 is an outline configuration diagram illustrating a basic example 1 of a circuit on a probe card of an inspection apparatus according to an embodiment of the present invention.

A basic circuit configuration on the probe card 10 of this embodiment is, as shown in FIG. 3, mainly configured by a branching portion 12 for branching a power supply channel 11 into plural (four in this embodiment), four power supply wiring portions 13-1 to 13-4 branching by the branching portion 12, power supply relays 14-1 to 14-4 provided at each of the power supply wiring portions 13-1 to 13-4, current detection mechanisms 15-1 to 15-4 provided at each of the power supply wiring portions 13-1 to 13-4 in series with the power supply relays 14-1 to 14-4, and a control mechanism 16 for controlling the entirety. The power supply relays 14-1 to 14-4 are relay switches opening and closing controlled by the control mechanism 16. The current detection mechanisms 15-1 to 15-4 transmit detected current values to the control mechanism 16. The four power supply wiring portions 13-1 to 13-4 are connected to a probe 19, respectively. And they are connected to power supply terminals of a plurality of IC chips 20 by each of the probes 19. The probes 19 are installed in the number according to the number of power supply terminals of the IC chips 20 to be inspected. The branching portion 12 sets the number of branches according to the number of the power supply channels 11 with respect to the number of probes 19.

The automatic switching mechanism is disposed in each of the plurality of power supply channels 11 (only one of them is described in this embodiment for convenience) to which the power supply of an external tester 18 is supplied and branches each of the power supply channels 11 to each of the plurality of power supply wiring portions 13 and connects it to each of the probes 19 and also has a function to shut off the power supply wiring portion 13 on the basis of electrical fluctuation (a state in which overcurrent flows or no or little current flows). This automatic switching mechanism is configured, in this embodiment, by the branching portion 12 and the power supply relays 14-1 to 14-4.

The electrical fluctuation detection mechanism is provided at the branching portion 12 as the automatic switching mechanism and each of the power supply wiring portions 13-1 to 13-4 after branching by the power supply relays 14-1 to 14-4, respectively, and has a function to detect electrical fluctuation if the electrical fluctuation is caused by presence of a defective product in the plurality of IC chips 20. The electrical fluctuation detection mechanism is configured by the current detection mechanisms 15-1 to 15-4 for detecting current fluctuation as the electrical fluctuation in this embodiment.

The control mechanism 16 has a function to shut off the power supply wiring portion 13 with current fluctuation by the power supply relays 14-1 to 14-4 when the current fluctuation such as overcurrent is detected by at least one of the current detection mechanisms 15-1 to 15-4 and to reduce an influence of the electrical fluctuation on the normal IC chip 20 connected to the other power supply wiring portions 13 branching from the common power supply channel 11 (four power supply wiring portions 13 are branched from the power supply channel 11 in this embodiment). Moreover, the control mechanism 16 performs transmission and reception of a signal A with the tester 18 and transmits information of the IC chip 20 with current fluctuation to the tester 18.

As a result, the number of the IC chips 20 that can be simultaneously measured by the limited number of the power supply channels 11 can be considerably increased. In this case, the IC chips 20 in the number four times of the number of the power supply channels 11 can be inspected. Moreover, the defective chip can be reliably shut off without giving an influence on the normal IC chip 20.

In this embodiment, since the control of the power supply relays 14-1 to 14-4 is executed in the probe card 10 and made independent from the tester 18, the number of IC chips 20 to be inspected can be increased without being limited by the number of control signals from the tester 18.

Also, since the control function of the power supply relays 14-1 to 14-4 is configured by simple circuit components, a circuit mechanism can be arranged even in a small mounting area on the probe card 10, and the existing probe cad 10 can be used as it is. Thus, a power supply cord or the like for controlling the power supply relays 14-1 to 14-4 is not needed any more and a size can be reduced from a conventional inspection apparatus having the same function.

First Embodiment

Subsequently, a specific first embodiment on the basis of the basic example 1 will be described referring to FIG. 4. Since the overall circuit configuration on the probe card 10 of this first embodiment is substantially the same as the above-mentioned basic example 1, the same reference numerals are given to the same members and the description will not be repeated here. In this first embodiment, resistors 22-1 to 22-4 are serially provided on the tester 18 side of the power supply relays 14-1 to 14-4. Moreover, one side of each of the detection relays 23-1 to 23-4 is connected to the probe 19 side of one of the power supply relays 14-1 to 14-4. The other side of each of the detection relays 23-1 to 23-4 is connected to a power supply sense line 25 of the tester 18 and to one input of a differential amplifier 26 of the control mechanism 16. The other input of the differential amplifier 26 is connected to a test power supply line 27 of the tester 18 and monitors any changes in the voltage in each of the power supply wiring portions 13-1 to 13-4. The differential amplifier 26 is connected to a FAIL comparator 29 together with a FAIL DA 28. The FAIL comparator 29 outputs a signal to a FPGA 30 if an output potential of the differential amplifier 26 becomes higher than a set potential of the FAIL DA 28. The FPGA 30 controls the power supply relays 14-1 to 14-4 on the basis of a signal output of the FAIL comparator 29.

The FPGA 30 scans a current of each of the branched power supply wiring portions 13-1 to 13-4. An overcurrent amount is detected by a voltage drop at a detection point of the power supply wiring portions 13-1 to 13-4. Either of the connection of the resistors 22-1 to 22-4 and the power supply relays 14-1 to 14-4 may be on the test power supply side.

The current scanning for each of the power supply wiring portions 13-1 to 13-4 is performed to detect a potential after branching by sequentially switching the detection relays 23-1 to 23-4.

If overcurrent is detected by a defective chip in the IC chips 20 formed on a semiconductor wafer W, a voltage at a detection point of the power supply wiring portions 13-1 to 13-4 drops, the voltage drop is detected by a circuit in the control mechanism 16, and the power supply relays 14-1 to 14-4 of the applicable power supply wiring portions 13-1 to 13-4 is turned off so that an abnormal fluctuation amount in a voltage or current of the other normal chips is reduced and prevented.

Subsequently, an operation of the inspection apparatus will be described.

A tester, not shown, supplies a current to the IC chips 20 through the power supply wiring portions 13-1 to 13-4 by the power supply force line 27. In this state, scanning of the detection relays 23-1 to 23-4 is sequentially switched and controlled by the FPGA 30.

The potential of each of the power supply wiring portions 13-1 to 13-4 is sequentially inputted to the differential amplifier 26 of the control mechanism 16 by the scanning, and a change in the potential is detected in the differential amplifier 26.

When a current flowing through the power supply force line 27 passes through the resistors 22-1 to 22-4, a potential of $\Delta V = I \times R$ drops from the potential of a tester power supply. If the maximum current of the power supply of the tester 18 is 800 mA, for example, in the case of branching to four, the maximum current per inspection chip is 200 mA. In this case, in the overcurrent of R=0.1Ω and 1200 mA, $\Delta V$ drops by a potential of 20 mV.

A differential potential is detected by the differential amplifier 26 and amplified and outputted to the FAIL comparator 29. At this time, if the overcurrent is caused in the power supply wiring portions 13-1 to 13-4, an output voltage of the differential amplifier 26 becomes higher than the set potential of the FAIL DA 28 set in advance, and output signal of the FAIL comparator 29 is changed from a logical value "0" to "1", the overcurrent of the power supply wiring portions 13-1 to 13-4 is detected, and a signal is outputted to the FPGA 30.

If the output signal is inputted to the FPGA 30, by means of the control of the FPGA 30, the power supply relays 14-1 to 14-4 of the power supply wiring portions 13-1 to 13-4 in which the overcurrent is caused is controlled from ON to OFF, the power supply wiring portions 13-1 to 13-4 are shut off, and it is notified to the tester 18.

Basic Example 2

Subsequently, a basic example 2 will be described. Since an entire configuration of the basic example 2 is substantially the same as the above-mentioned basic example 1, the same reference numerals are given to the same members and the description will be omitted.

Figure 5:
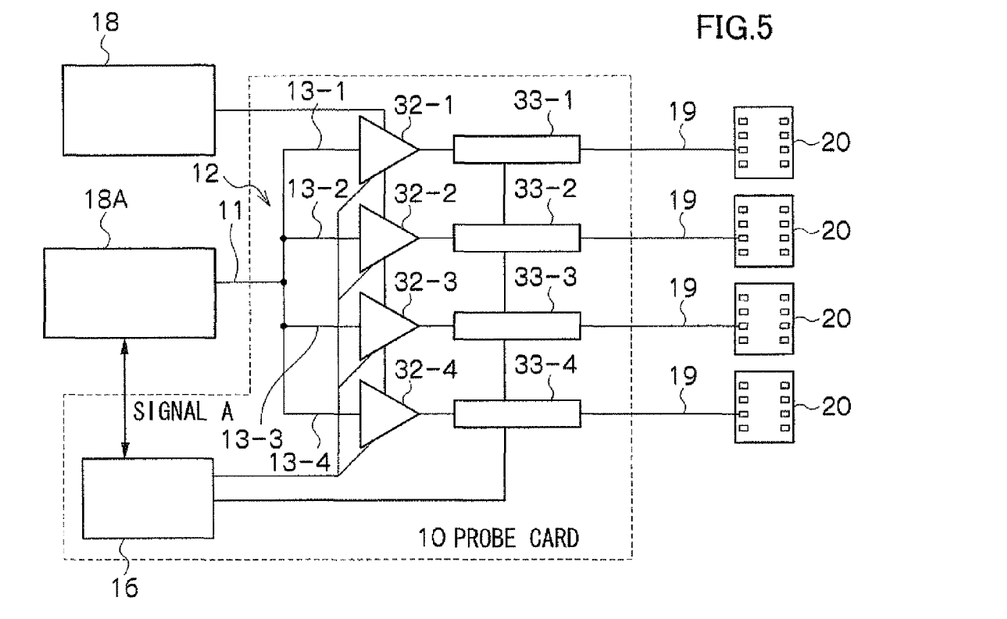
FIG. 5 is an outline configuration diagram illustrating a basic example 2 of a circuit on the probe card of the inspection apparatus according to the embodiment of the present invention.

In this basic example 2, as shown in FIG. 5, op amps 32-1 to 32-4 are used instead of the power supply relays 14-1 to 14-4 of the basic example 1, and voltage detection mechanisms 33-1 to 33-4 are used instead of the current detection mechanism 15-1 to 15-4. Moreover, apart from the power supply of the tester 18, a reference power supply 18A is provided.

The power supply of the tester 18 is applied to Vcc input terminals of the op amps 32-1 to 32-4 and used as a test power supply. A voltage of the reference power supply 18A is applied to the inputs of the op amps 32-1 to 32-4. Each of the op amps 32-1 to 32-4 is connected to the control mechanism 16 so that the power supply wiring portions 13-1 to 13-4 are shut off by control of the control mechanism 16. In this case, since the op amps 32-1 to 32-4 are used, the voltage detection mechanisms 33-1 to 33-4 are used for the power supply wiring portions 13-1 to 13-4.

As a result, if overcurrent flows through at least any one of the power supply wiring portions 13-1 to 13-4, a change in the corresponding voltage is detected by the voltage detection mechanisms 33-1 to 33-4, and a detection value is outputted to the control mechanism 16. As a result, the control mechanism 16 determines that a defective IC chip is present, shuts off the power supply wiring portions 13-1 to 13-4 by turning off the op amp in the op amps 32-1 to 32-4 disposed in the power supply wiring portions 13-1 to 13-4, respectively, connected to the defective IC chip and in which the overcurrent flows, and prevents an abnormal change in the voltage or current of the other normal IC chips 20.

The control mechanism 16 which indirectly detects the overcurrent by the voltage detection mechanisms 33-1 to 33-4 transmits information of the IC chip 20 in which the overcurrent occurred to the tester 18.

As a result, since the overcurrent in the power supply wiring portions 13-1 to 13-4 is detected by a voltage drop on the probe card 10 and the control mechanism 16 controls the current in the power supply wiring portions 13-1 to 13-4 in which the overcurrent occurred, the test power supply is shut off if the overcurrent occurs, and the other inspection targets IC branching from the same power supply channel 11 are prevented from becoming defective.

Since the control of the op amps 32-1 to 32-4 is executed by the control mechanism 16 in the probe card, it is not limited by the number of control signals from the tester 18 and does not have to be relied upon.

Since the configuration is made up of simple circuit components, the circuit configuration can be arranged in a small limited mounting area on the probe card, and the size of the inspection apparatus provided with the same function can be reduced as compared with that of the conventional one.

Second Embodiment

Figure 6:
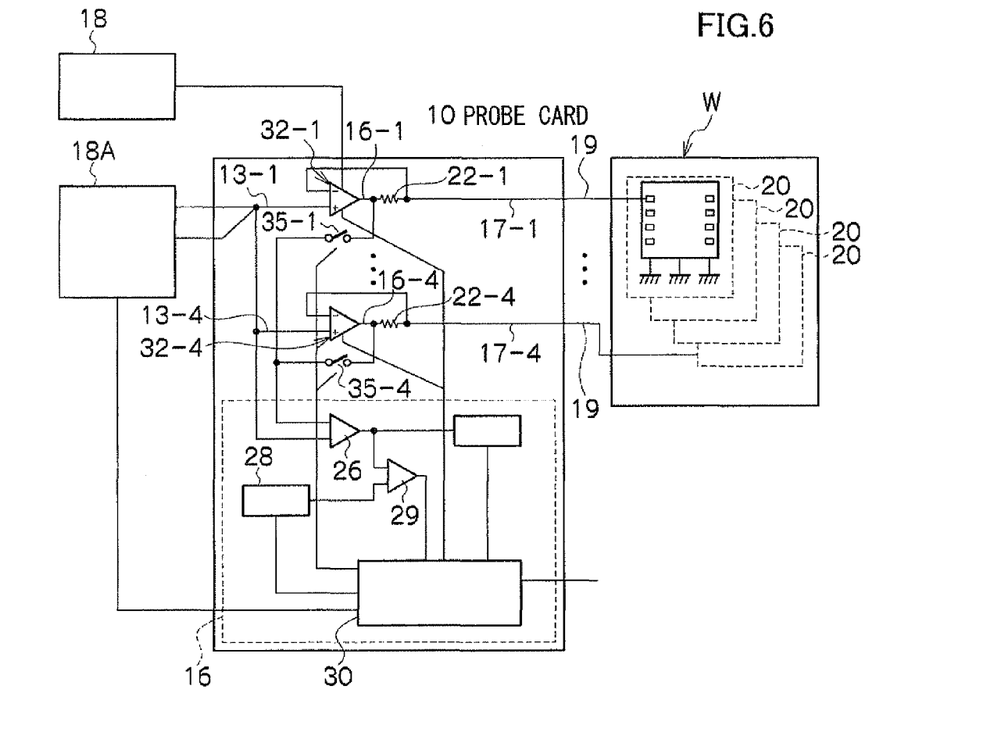
FIG. 6 is an outline configuration diagram illustrating an example 2 of a circuit on the probe card of the inspection apparatus according to the embodiment of the present invention.

Subsequently, a second embodiment will be described. The second embodiment uses, as shown in FIG. 6, a function of the op amps 32-1 to 32-4 as a noninverting amplifier circuit. The power supply of the tester 18 is connected to a Vcc terminal of the op amp. A power supply wiring portion 16-1 on the output side of the op amp 32-1 is connected to a power supply wiring portion 17-1 through the resistor 22-1, and the power supply wiring portion 17-1 is connected to a "− terminal" of the op amp 32-1. The power supply wiring portion 13-1 is connected to a "+ terminal" of the op amp 32-1, and a voltage of the reference power supply 18A is supplied. Thus, because of a characteristic of the noninverting amplifier circuit of the op amp, a power is outputted to the power supply wiring portion 17-1 on the basis of the power supply from the Vcc of the op amp 32-1, and the voltage of the power supply wiring portion 17-1 is outputted as a voltage with a value equal to the voltage of the reference power supply 18A inputted to the op amp 32-1. At this time, the voltage detection mechanisms 33-1 to 33-4 of the basic example 2 correspond to 16-1 to 16-4 in FIG. 6 of this embodiment.

Figure 4:
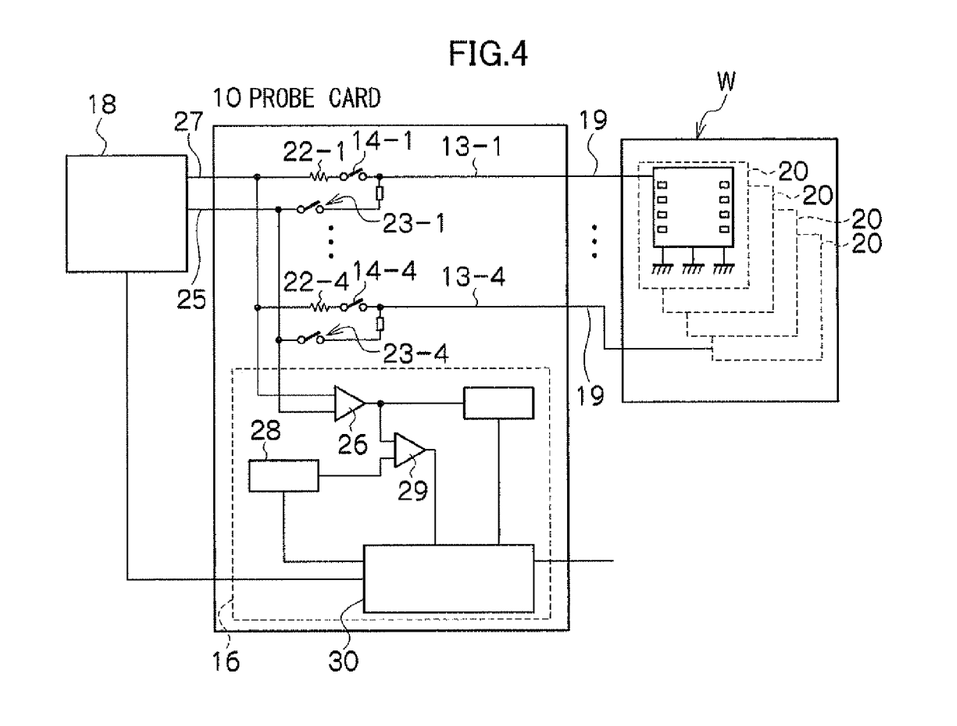
FIG. 4 is an outline configuration diagram illustrating an example 1 of a circuit on the probe card of the inspection apparatus according to the embodiment of the present invention.

The entire configuration of this second embodiment is substantially the same as the entire configuration of the first embodiment in FIG. 4. To the control mechanism 16 similar to the first embodiment in FIG. 4, an enable terminal of each of the op amps 32-1 to 32-4 is connected, and each of the op amps 32-1 to 32-4 is on and off controlled by the control mechanism 16.

Each of power supply relays 35-1 to 35-4 is connected to the output side of each of the op amps 32-1 to 32-4, respectively, and connected to one of the differential amplifier 26 of the control mechanism 16. Moreover, the output side of each of the op amps 32-1 to 32-4 is connected to input of one of themselves and compared with the reference voltage.

As a result, if overcurrent flows through at least any one of the power supply wiring portions 16-1 to 16-4, the voltage raised with that is outputted to the differential amplifier 26 of the control mechanism 16. Then, if it exceeds a threshold value in the differential amplifier 26 and the FAIL comparator 29, the FPGA 30 controls the op amps 32-1 to 32-4 on the basis of the output of the FIAL comparator 29 and shuts off the one in which the overcurrent flows among the power supply wiring portions 16-1 to 16-4.

If the maximum current of the power supply of the tester 18 is 800 mA, in the case of branching to four, the maximum current per inspection chip is 200 mA.

The control mechanism 16 scans and detects a voltage of each of the branching power supply wiring portions 16-1 to 16-4. An overcurrent amount is detected by a voltage rise in the power supply wiring portions 16-1 to 16-4.

The current scanning for each of the power supply wiring portions 16-1 to 16-4 is performed by switching the power supply relays 35-1 to 35-4 and sequentially comparing the potentials after the branching similarly to the above-mentioned first embodiment.

If an abnormal current caused by electrical fluctuation is detected by a defective chip in the inspected ICs, the voltage of the power supply wiring portion in which the overcurrent flows in the power supply wiring portions 16-1 to 16-4 with the abnormal current detected is raised. This is determined by the differential amplifier 26 and the FAIL comparator 29, and if the voltage fluctuation of the power supply wiring portions 16-1 to 16-4 exceeds a set value, the electricity is turned off by using a shut-off function of the op amp.

Specifically, the operation is as follows.

A potential equal to the potential of the reference power supply 18A is outputted to the power supply wiring portions 17-1 to 17-4 by the op amps 32-1 to 32-4.

By means of the control mechanism 16, the power supply relays 35-1 to 35-4 are sequentially scanned and controlled. By means of the power supply relays 35-1 to 35-4, the output potential of each op amp is sequentially detected by the differential amplifier 26 or the like in the control mechanism 16 through the above scanning control.

Specifically, by means of the current flowing through the power supply wiring portions 16-1 to 16-4, a potential change of $\Delta V = I \times R$ is caused at both ends of the resistors 22-1 to 22-4. If a current of 200 mA flows through the power supply wiring portion 16-1 and the resistor 22-1 is 0.1Ω, for example, the potential of the power supply wiring portion 16-1 rises by 20 my from the potential of the power supply wiring portion 17-1. At this time, the potential of the power supply wiring portion 17-1 is maintained at the same voltage as that of the reference power supply 18A by the op amp 32-1. Thus, if the voltage of the reference power supply 18A is equal to that of the power supply wiring portion 17-1, the voltage of the power supply wiring portion 16-1 rises by 20 mV from the voltage of the reference power supply 18A. Then, the applicable potential of the power supply wiring portion 16-1 whose potential has been raised is inputted to the differential amplifier 26 of the control mechanism 16, and the potentials of the power supply wiring portion 16-1 and the reference power supply 18A are compared, amplified and outputted in the differential amplifier 26. Then, the output of the differential amplifier 26 becomes larger than the set potential of the FAIL DA 28 set in advance. As a result, the voltage rise is detected by the FAIL comparator 29, its output signal changes from the logical value "0" to "1", and the overcurrent of the power supply wiring portions 16-1 to 16-4 with the logical value "1" is detected and outputted to the FPGA 30.

If the output signal is inputted to the FPGA 30, by means of the control of this FPGA 30, a signal to turn off enable is inputted to the enable terminals of the op amps 32-1 to 32-4, the op amps 32-1 to 32-4 are controlled from on to off, and the power supply wiring portions 16-1 to 16-4 are shut off.

As a result, the same actions and effects as those of the above basic examples and the like are exerted.

Third Embodiment

Figure 7:
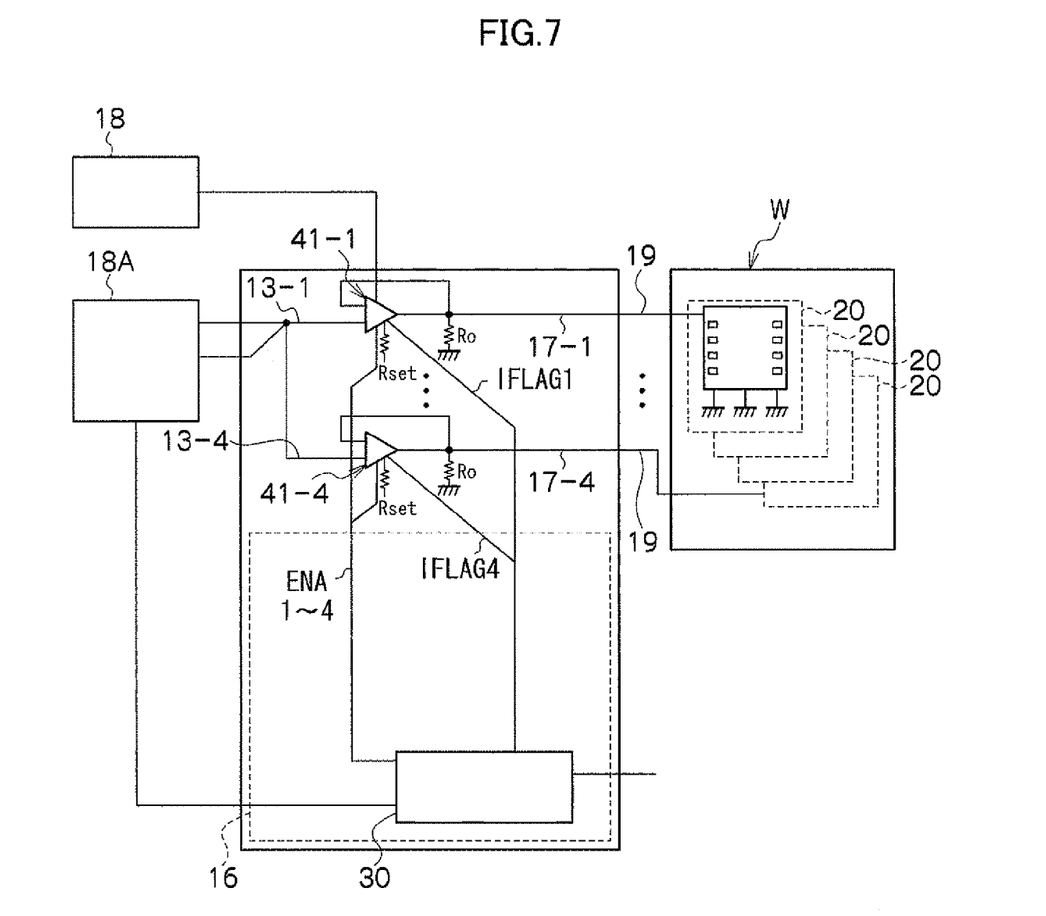
FIG. 7 is an outline configuration diagram illustrating an example 3 of a circuit on the probe card of the inspection apparatus according to the embodiment of the present invention.

Subsequently, a third embodiment will be described. This third embodiment uses, as shown in FIG. 7, op amps 41-1 to 41-4 with a current detection function instead of the op amps 32-1 to 32-4 in the above-mentioned second embodiment. As a result, the differential amplifier 26 or the like is not needed any more, and the control mechanism 16 is configured only by the FPGA 30.

The op amps 41-1 to 41-4 have the following functions. The following functions are those a publicly known op amp usually has, and the invention of this third embodiment uses the function of the op amp.

Signals ENA 1 to 4 inputted to the op amps 41-1 to 41-4 are connected to EnablePin of the op amps 41-1 to 41-4, become enable by High input, and the op amps 41-1 to 41-4 operate as original op amps, and a current of the power supply of the tester 18 flows through the power supply wiring portions 17-1 to 17-4. If the ENA signal is Low input, the op amps 41-1 to 41-4 are shut down, the current does not flow through the power supply wiring portions 17-1 to 17-4, and a defective chip is separated.

A OVER CURR STATUS signal is connected to IFLAG of the op amps 41-1 to 41-4. This IFLAG outputs a Low signal if a Vo output to the power supply wiring is not more than a current limit value and outputs a High signal if a current flows with the Vo output not less than the current limit value.

Setting of the current limit values of the op amps 41-1 to 41-4 is made by inserting a resistor Rset between a V-terminal and an ISET terminal generally provided in the op amps 41-1 to 41-4.

In the op amps 41-1 to 41-4, if the current limit detection value of 0.5 A is to be set, for example, a value of the resistor Rset is set at 23.2 kΩ. Since the value is different depending on the op amps, the setting is made for each op amp. Then, the value of the resistor Rset is set to a value of 23.2 kΩ or other values, and the current limit detection value is set arbitrarily.

The above functions that the op amp originally has are used as the automatic switching mechanism and the electrical fluctuation detection mechanism of the present invention.

A basic operation of the op amps 41-1 to 41-4 is as follows.

The power supply of the tester 18 is a V+ terminal input of the op amps 41-1 to 41-4 and a power supply voltage of the op amps 41-1 to 41-4. The power supply wiring portions 17-1 to 17-4 are Vo outputs of the op amps 41-1 to 41-4.

The voltage of the power supply of the tester 18 is supposed to be a voltage higher than the voltage of the power supply wiring portions 17-1 to 17-4 to be used. By connecting the reference power supply 18A to the +IN of the op amps 41-1 to 41-4 and connecting the power supply wiring portions 13-1 to 13-4 to −IN of the op amps 41-1 to 41-4, the potential of the power supply wiring portions 17-1 to 17-4, which is the Vo output of the op amps 41-1 to 41-4, is voltage-amplified to 1.00 times of the reference voltage. That is, the power supply wiring portions 17-1 to 17-4 are controlled to a potential equal to the input voltage of the reference power supply 18A by the op amps 41-1 to 41-4.

The power supply of the power supply wiring portions 17-1 to 17-4 of the op amps 41-1 to 41-4 is supplied from the power supply of the tester 18. The reference power supply 18A only inputs a voltage but does not consume a current and generates the same potential as the reference power supply 18A in the power supply wiring portions 17-1 to 17-4. Also, the current consumed by the power supply wiring portions 17-1 to 17-4 is supplied from the power supply of the tester 18.

At this time, the voltages of the power supply wiring portions 17-1 to 17-4 become the same voltage as the reference voltage, and the potential of the power supply of the tester 18 becomes a voltage higher than the power supply wiring portions 17-1 to 17-4. At this time, even if the voltage of the power supply of the tester 18 is fluctuated, the potentials of the power supply wiring portions 17-1 to 17-4 can maintain the voltage equal to the reference voltage by the function of the op amps 41-1 to 41-4.

In the op amps 41-1 to 41-4, an operation in the normal time is as follows.

When the current limit value of the op amps 41-1 to 41-4 is set to 0.5 A, if the ENA signal is High and the current of the power supply wiring portions 17-1 to 17-4 is not more than 0.5 A, the op amps 41-1 to 41-4 is brought into the enable state, and the voltage of the power supply wiring portions 17-1 to 17-4 becomes the same as the reference power supply 18A.

An operation if overcurrent occurs in the power supply wiring portions 13-1 to 13-4 is as follows.

When current limit value of the op amps 41-1 to 41-4 is set to 0.5 A, if a current of not less than 0.5 A flows through the power supply wiring portions 13-1 to 13-4 due to a defective chip, the IFLAG terminal of the op amp is changed from Low to High.

If the High signal of the IFLAG terminal is inputted in the FPGA 30, the signals ENA 1 to 4, which are output signals to the Enable terminal of the op amps 41-1 to 41-4 are changed from High to Low. The op amps 41-1 to 41-4 to which the ENA signals are inputted are shut down, and the power supply wiring portions 17-1 to 17-4 on the output is brought into Hi-impedance and shut down. As a result, if the overcurrent flows through the power supply wiring portions 17-1 to 17-4, the shut-down function of the op amps 41-1 to 41-4 works and shuts down the current.

If the op amps 41-1 to 41-4 are shut down due to occurrence of the overcurrent in the power supply wiring portions 17-1 to 17-4, the output Vo becomes Hi-impedance and there is a possibility that the electric charges of the power supply wiring portions 17-1 to 17-4 cannot be brought to 0V, and a resistor is added to between the power supply wiring portions 17-1 to 17-4 and GND. By adding a resistor R0 with several kΩ to several hundred kΩ to between the power supply wiring portions 17-1 to 17-4 and the GND, the potentials of the power supply wiring portions 17-1 to 17-4 can be dropped to 0 V (GND potential).

As a result, the same actions and effects as those of the above-mentioned basic examples and embodiments can be exerted.

Moreover, since the op amps 41-1 to 41-4 play a function to sense a change in the current caused by a defective chip, to shut it down and to detect the electrical fluctuation, the op amps 41-1 to 41-4 can play both functions of the automatic switching mechanism and the electrical fluctuation detection mechanism. As a result, since the current detection mechanisms 15-1 to 15-4 can be omitted, a configuration of circuit components can be further simplified. As a result, the circuit mechanism can be arranged even in a small mounting area on the probe card 10, the existing probe card 10 can be used as it is, and a size can be reduced from a conventional inspection apparatus having the same function.

Variation

As an inspection target, not limited to a plurality of chips in a single wafer, there can be in various modes such as divided plural chips and the like, and the present invention can be also applied to all of them.

As electrical fluctuation to be detected by the electrical fluctuation detection mechanism, overcurrent is used as a target, but to the contrary, a state in which no current flows can be detected. According to the current state caused by a defective chip, the electrical fluctuation detection mechanism is set.

The tester power supply 18 in the second and third embodiments can be also realized with an equivalent function by supplying a part of or a whole power from a power supply circuit other than the tester.

In the above-mentioned basic example 1 or the like, the power supply channel 11 is branched into four in the branching portion 12 so as to have the four power supply wiring portions 13-1 to 13-4, but they may be two, three or five or more power supply wiring portions. The number of branching is set according to the numbers of the power supply channels 11 and the IC chips 20.

INDUSTRIAL APPLICABILITY

The probe card and the inspection apparatus of the present invention can be applied to all the probe cards in which the number of the IC ships 20 to be inspected is larger than that of the power supply channels 11 and also can be applied to all the inspection apparatuses in which the probe card is used.

The invention claimed is:

1. A probe card comprising:
    a plurality of probes mounted on the probe card to be brought into contact with a plurality of electrodes of a single or a plurality of inspection targets, respectively;
    a power supply channel electrically connecting each of the plurality of probes to the tester that is external to and separate from the probe card and supplying test power from the tester, to the plurality of electrodes of the inspection targets, respectively;
    branching lines on the probe card that are connected to each of the power supply channels, branching each of the power supply channels into a plurality of power supply wiring portions on the probe card and respectively connected to the probes such that each one of the power supply lines is connected to at least two of the probes;
    a switching mechanism in each of the power supply wiring portions on the probe card, which switching mechanism shuts off the test power to the power supply wiring portion in accordance with detection of electrical fluctuation in the power supply wiring portion;
    an electrical fluctuation detection mechanism disposed in each of the power supply wiring portions on the probe card and which detects electrical fluctuation in a power supply wiring portion due to presence of an abnormality in a single or plural inspection targets to which the power supply wiring portion is connected; and
    a control mechanism on the probe card which, responsive to detection of electrical fluctuation by the electrical fluctuation detection mechanism, and independently of the tester that is external to the probe card, shuts off the test power to a respective one of the probes that is connected to the power supply wiring portion in which the electrical fluctuation is detected, by operation of a respective one of the switching mechanisms.

2. The probe card according to claim 1, wherein the electrical fluctuation detection mechanism detects fluctuation in a current or a voltage in the power supply wiring portion.

3. The probe card according to claim 1 wherein each switching mechanism is a power relay switch which opens and closes the power supply wiring portion on the basis of the detected electrical fluctuation.

4. The probe card according to claim 1,
    wherein the electrical fluctuation detection mechanisms are detection relay switches, each detection relay switch connected to one of the power supply wiring portions and sequentially switched by the control mechanism; and
    wherein the control mechanism comprises:
    a differential amplifier connected to the detection relay switches, the differential amplifier comparing an output voltage of a detection relay switch connected to the power supply wiring portion and the test voltage supplied by a power supply force line of the tester, and outputting a signal if the output voltage of the detection relay switch changes relative to the test voltage; and
    a comparator which compares the output voltage of the differential amplifier and a set potential and outputs a signal for shutting down the power supply wiring portion if the output voltage of the differential amplifier is higher than the second reference voltage.

5. The probe card according to claim 1, wherein an op amp serves as the switching mechanism and the electrical fluctuation detection mechanism in each power supply wiring portion, detects electrical fluctuation in a power supply wiring portion and, responsive to detection of electrical fluctuation, outputs a signal for controlling the shut down of the test power to the respective one of the probes connected to the power supply wiring portion in which the electrical fluctuation is detected to occur.

6. The probe card according to claim 1 wherein the control mechanism transmits information, identifying a defective IC chip exhibiting current fluctuation, to the external tester.

7. The probe card according to claim 1 wherein each switching mechanism is an op amp and each electrical fluctuation detection mechanism is a voltage detection mechanism.

8. The probe card according to claim 1 wherein each switching mechanism is a power relay switch and each electrical fluctuation detection mechanism is a current detection mechanism.

* * * * *